United States Patent
Su et al.

(10) Patent No.: US 8,232,721 B2
(45) Date of Patent: Jul. 31, 2012

(54) EFFICIENCY ENHANCEMENT METHODS FOR OLED LIGHT SOURCE THROUGH INDEX BRIDGING

(75) Inventors: Wencheng Su, Cupertino, CA (US); Benjamin Krummacher, Sunnyvale, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 716 days.

(21) Appl. No.: 11/223,377

(22) Filed: Sep. 8, 2005

(65) Prior Publication Data
US 2007/0052350 A1    Mar. 8, 2007

(51) Int. Cl.
*H01J 1/62*    (2006.01)
*H01J 63/04*    (2006.01)

(52) U.S. Cl. .................. 313/506; 313/501; 313/502

(58) Field of Classification Search .......... 313/495–512, 313/110; 607/81–92; 604/304, 293; 606/10, 606/20, 6–9, 27
See application file for complete search history.

(56) References Cited

U.S. PATENT DOCUMENTS

| | | | |
|---|---|---|---|
| 2001/0033135 A1* | 10/2001 | Duggal et al. | 313/506 |
| 2003/0098651 A1* | 5/2003 | Lin et al. | 313/600 |
| 2005/0070976 A1* | 3/2005 | Samuel et al. | 607/88 |

FOREIGN PATENT DOCUMENTS

| | | | |
|---|---|---|---|
| JP | 2003-257622 | | 9/2003 |
| JP | 2004-39317 | | 2/2004 |
| JP | 2004039317 A | * | 2/2004 |
| WO | WO 03/016422 | * | 2/2003 |

OTHER PUBLICATIONS

Extended European Search Report in Application Serial No. 06017932.2, dated Nov. 18, 2010, 7 pages.

* cited by examiner

*Primary Examiner* — Anh Mai
*Assistant Examiner* — Elmito Breval
(74) *Attorney, Agent, or Firm* — Fish & Richardson P.C.

(57) ABSTRACT

An apparatus such as a light source is disclosed which has an OLED device and an index bridging elastomer disposed on the substrate or transparent electrode of said OLED device and on the exterior of said OLED device. The elastomer bridges the refractive index between the substrate and an intended target for said apparatus.

24 Claims, 3 Drawing Sheets

EFFICIENCY ENHANCEMENT METHODS FOR OLED LIGHT SOURCE THROUGH INDEX BRIDGING

BACKGROUND

Display and lighting systems based on LEDs (Light Emitting Diodes) have a variety of applications. Such display and lighting systems are designed by arranging a plurality of photo-electronic elements ("elements") such as rows of individual LEDs. LEDs that are based upon semiconductor technology have traditionally used inorganic materials, but recently, the organic LED ("OLED") has come into vogue. Examples of other elements/devices using organic materials include organic solar cells, organic transistors, organic detectors, and organic lasers.

An organic OLED is typically comprised of two or more thin organic layers (e.g., an electrically conducting organic layer and an emissive organic layer where the emissive organic layer emits light) which separate an anode and a cathode. Under an applied forward potential, the anode injects holes into the conducting layer, while the cathode injects electrons into the emissive layer. The injected holes and electrons each migrate (under the influence of an externally applied electric field) toward the oppositely charged electrode and produce an electroluminescent emission upon recombination in the emissive layer. Similar device structure and device operation applies for OLEDs consisting of small molecule organic layers and/or polymeric organic layers. Each of the OLEDs can be a pixel element in a passive/active matrix OLED display or an element in a general area light source and the like. The displays and light sources may have one or more common layers such as common substrates, anodes or cathodes and one or more active/passive organic layers sandwiched in between to emit light in particular spectra. They may also consist of photo-resist or electrical separators, bus lines, charge transport and/or charge injection layers, and the like. Typically, a transparent or semi-transparent glass substrate is used in bottom-emitting OLED devices.

Organic light-emitting diodes (OLEDs) based on small molecules or polymers are being considered as a very promising potential technology for solid state lighting applications. OLED light sources can be used for many special or general illuminating applications, for example, it can be used as a light source for the treatment of human diseases. Compared to inorganic LEDs, OLEDs have shown many special advantages, such as easy fabrication, high throughput, large emissive area, and so on. For lighting applications, high device efficiency is desired for low power consumption, low device temperature rise during operation, and other beneficial effects. For OLEDs, the biggest limiting factor for its efficiency is the wave guiding effect within the device and substrate. As a result, only less than 40% of the totally generated light in the device can escape the front glass and illuminate the needed area. Therefore there is a need to design efficient OLED light sources for many applications.

DETAILED DESCRIPTION

Figure 1:
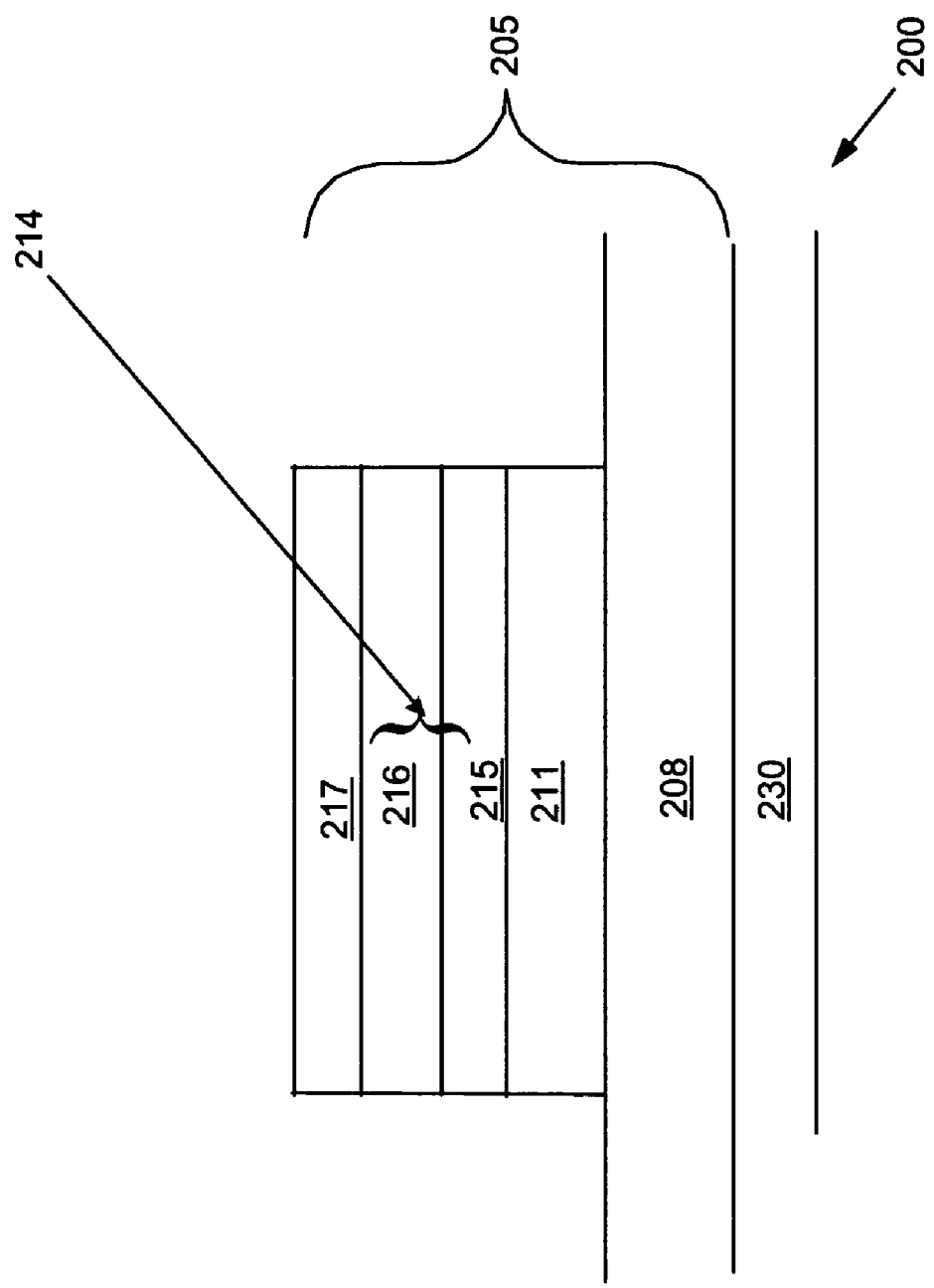
FIG. 1 shows a cross-sectional view of an embodiment of an electroluminescent apparatus according to at least one embodiment of the invention.

In at least one embodiment of the invention, an electroluminescent (EL) apparatus is disclosed which utilizes 1) an OLED device including a transparent substrate or other transparent outer layer; and 2) an index bridging elastomer disposed in the path of light emission from the OLED device and on the outside of the OLED device on the exterior side of the substrate/outer layer, wherein the elastomer has a refractive index roughly matching that of the substrate and/or the intended target of the light emitted by the OLED device. In at least one embodiment of the invention, the index bridging elastomer is made from silicone.

One novel aspect of the invention involves eliminating the wave guiding effect in the glass substrate (or other transparent substrate, either rigid or flexible) by putting an elastomeric material between an OLED substrate (or other transparent) surface and an intended target such as treatable human skin or lighting "covers" wherein the light source is protected by a transparent or semi-transparent cover. The wave guiding effect in the glass substrate (or other transparent layer) is due to the large difference in refractive index between substrate/layer and the air between the substrate/layer and the intended target. Total internal reflection occurs when the light is emitted at an angle larger than the critical incident angle. With regard to applications related to the human body, human skin surface is glass-like with a refractive index of about 1.47. Thus an index bridging elastomer between the OLED glass substrate and the human skin surface should be able to effectively eliminate the wave guiding effect in the OLED glass substrate. Likewise, with regard to lighting cover applications, a lighting cover is usually made from transparent or semi-transparent glass or plastic materials, which usually have similar or larger refractive index compared to the OLED glass substrate. An index bridging elastomer between the OLED glass substrate and the lighting cover also should effectively eliminate the waving guiding effect in the OLED glass substrate.

With regard to the intended target being human skin, desired properties of materials used in fabricating an index bridging elastomer include the following:

1) It should have no strong absorption effect with respect to the emissive wavelength of OLED devices. Such materials should be compatible with human skin and should not cause side effects with the skin or with the applied drug.

(2) The refractive index of the elastomer is preferably between the glass and skin or very close to both the glass and skin.

(3) Such elastomeric materials should have suitable mechanical properties for the intended application. For instance, the elastomer should be soft enough such that it can form a seamless contact with both the glass surface and the skin surface with a very small magnitude of compressed force. The elastomeric materials also should be hard enough such that the materials will not change its shape permanently or flow out of the emissive area during handling or operating period. Dramatic shape change or flow could cause air gap and affect the light output. In some embodiments of the invention, pressure-sensitive adhesives and/or very thin layer of liquid gel can be used to enhance the interfacial contact.

In some embodiments, the thickness and the shape of the skin-contact surface for the elastomeric materials can also be adjusted based on the applied area. For example, based on the shape of the skin surface, the skin-contact surface of the elastomeric materials can be fabricated into corresponding shape so that they perfectly fit to each other without using too much external force.

By using such an elastomer between OLED glass surface and skin surface, the wave guiding effect for an OLED device can be eliminated and most light generated will be effectively transmitted to the intended target area. This can also result in significant improvement in the total light output, reducing the required driving power and minimizing the temperature rise during operation. Such an index bridging elastomer can also act as a thermal insulating layer, preventing the heat flow directly to the skin or intended target. It also acts as a buffer layer to avoid any direct contact between the glass and skin surface. One example of elastomeric materials which can be utilized in some embodiments is commercially available silicone elastomer.

With regard to the intended target being lighting cover or similar applications, desired properties of materials used in fabricating an index bridging elastomer include the following:

1) It should have no strong absorption effect with respect to the emissive wavelength of OLED devices. Such materials should be compatible with the lighting cover.

(2) The refractive index of the elastomer is preferably similar to that of the OLED glass substrate and similar or smaller than that of the lighting cover.

(3) The elastomeric materials can be applied in a similar ways as those in human skin target. Alternatively, it can be applied in the form of liquid to fill the gap between the OLED glass substrate and the lighting cover, and then cured or solidified by heat, moisture or UV irradiation.

FIG. 1 shows a cross-sectional view of an embodiment of an EL (electroluminescent) apparatus 200 according to at least one embodiment of the invention. The EL apparatus 200 includes an OLED device 205. OLED device 205 includes substrate 208 and a first electrode 211 on the substrate 208. The first electrode 211 may be patterned or un-patterned. The OLED device 205 also includes a semiconductor stack 214 on the first electrode 211. The semiconductor stack 214 includes at least the following: (1) a hole injection layer/anode buffer layer (HIL/ABL) 215 and (2) an active light emitting layer (EML) 216.

As shown in FIG. 1, the OLED device 205 is a bottom-emitting device. As a bottom-emitting device, the first electrode 211 would act as an anode, and the HIL/ABL 215 would be disposed on the first electrode 211, and the EML 216 would be disposed on the HIL/ABL 215. The OLED device 205 also includes a second electrode 217 on the semiconductor stack 214. Other layers than that shown in FIG. 1 may also be added such as second emissive layer, second and third emissive layers, electron/hole transporting layers, insulating layers, barrier layers, electron/hole injection and blocking layers, getter layers, and so on. An OLED device can also include two or more light-emissive units provided between an anode electrode and a cathode electrode. Each of the light-emissive units includes at least one light-emissive layer. The light-emissive units are partitioned from each other by at least one charge generation layer. In accordance with the invention, an index bridging elastomer 230 is disposed on the outside of the OLED device 205. More specifically, in the configuration shown, the index bridging elastomer 230 is disposed on the substrate 208. The OLED device 205 and the index bridging elastomer 230 together comprise the EL apparatus 200. Exemplary embodiments of these layers are described in greater detail below.

Substrate 208:

The substrate 208 can be any material, which can support the additional layers and electrodes, and is transparent or semi-transparent to the wavelength of light emitted by the OLED device 205. Alternatively, the substrate 208 can be opaque (when used in top-emitting devices). Preferable substrate materials include glass, quartz, silicon, and plastic, preferably, thin, flexible glass. The preferred thickness of the substrate 208 depends on the material used and on the application of the device. The substrate 208 can be in the form of a sheet or continuous film. The continuous film is used, for example, for roll-to-roll manufacturing processes which are particularly suited for plastic, metal, and metallized plastic foils.

First Electrode 211:

In the bottom-emitting configuration, the first electrode 211 functions as an anode (the anode is a conductive layer which serves as a hole-injecting layer). Typical anode materials include metals (such as platinum, gold, palladium, indium, and the like); metal oxides (such as lead oxide, tin oxide, indium-tin oxide, and the like); graphite; doped inorganic semiconductors (such as silicon, germanium, gallium arsenide, and the like); and doped conducting polymers (such as polyaniline, polypyrrole, polythiophene, and the like). Preferably, the first electrode 211 is comprised of indium-tin oxide (ITO).

The first electrode 211 is preferably transparent or semi-transparent to the wavelength of light generated by the OLED device 205. Preferably, the thickness of the first electrode 211 is from about 10 nanometers ("nm") to about 1000 nm, more preferably from about 50 nm to about 200 nm, and most preferably is about 100 nm.

The first electrode layer 211 can typically be fabricated using any of the techniques known in the art for deposition of thin films, including, for example, vacuum evaporation, sputtering, electron beam deposition, or chemical vapor deposition, using for example, pure metals or alloys, or other film precursors.

HIL/ABL 215:

The HIL/ABL 215 has good hole conducting properties and is used to effectively inject/transport holes from the first electrode 211 to the EML 216. The HIL/ABL 215 is made of polymers or small molecule materials or other organic or partially organic material. For example, the HIL/ABL 215 can be made from tertiary amine or carbazole derivatives both in their small molecule or their polymer form, conducting polyaniline ("PANI"), or PEDOT:PSS (a solution of poly(3, 4-ethylenedioxythiophene) ("PEDOT") and polystyrene-sulfonic acid ("PSS") (available as Baytron P from HC Starck). The HIL/ABL 215 can have a thickness from about 5 nm to about 1000 nm, and is conventionally used from about 50 to about 250 nm.

Other examples of the HIL/ABL 215 include any small molecule materials and the like such as plasma polymerized fluorocarbon films (CFx) with preferred thicknesses between 0.3 and 3 nm, copper phthalocyanine (CuPc) films with preferred thicknesses between 10 and 50 nm.

The HIL/ABL 215 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. A hole transporting and/or buffer material is deposited on the first electrode 211 and then allowed to dry into a film. The dried film represents the HIL/ABL 215. Other deposition methods for the HIL/ABL 215 include plasma polymerization (for CFx layers), vacuum deposition, or vapor phase deposition (e.g. for films of CuPc).

EML 216:

The active light emissive layer (EML) 216 is comprised of an organic electroluminescent material which emits light upon application of a potential across first electrode 211 and second electrode 217. The EML may be fabricated from materials organic or organo-metallic in nature. As used herein, the term organic also includes organo-metallic materials. Light-emission in these materials may be generated as a result of fluorescence or phosphorescence. Examples of such organic electroluminescent materials include but not limited to:

(i) poly(p-phenylene vinylene) and its derivatives substituted at various positions on the phenylene moiety and also substituted at various positions on the vinylene moiety;

(ii) poly(arylene vinylene), where the arylene may be such moieties as naphthalene, anthracene, furylene, thienylene, oxadiazole, and the like;

(iii) polyp-phenylene and its derivatives substituted at various positions on the phenylene moiety, including ladder polymer derivatives such as poly(9,9-dialkyl fluorene) and the like;

(iv) poly(arylenes) where the arylene may be such moieties as naphthalene, anthracene, furylene, thienylene, oxadiazole, and the like; and their derivatives substituted at various positions on the arylene moiety;

(v) rigid rod polymers such as poly(p-phenylene-2,6-benzobisthiazole), poly(p-phenylene-2,6-benzobisoxazole), polyp-phenylene-2,6-benzimidazole), and their derivatives.

(vi). polyfluorene-like polymers include that emit green, red, blue, or white light or their families, copolymers, derivatives, or mixtures thereof.

(vii) polyspirofluorene-like polymers, their families, co-polymers and derivatives.

Alternatively, rather than polymers, small organic molecules that emit by fluorescence or by phosphorescence can serve as the organic electroluminescent layer. Examples of small-molecule organic electroluminescent materials include but not limited to: tris(8-hydroxyquinolinato)aluminum (Alq), 1,3-bis(N,N-dimethylaminophenyl)-1,3,4-oxidazole (OXD-8), oxo-bis(2-methyl-8-quinolinato)aluminum, bis(2-methyl-8-hydroxyquinolinato) aluminum, bis(hydroxybenzoquinolinato) beryllium ($BeQ.sub.2$), bis(diphenylvinyl)biphenylene (DPVBI), arylamine-substituted distyrylarylene (DSA amine), tris(2-phenylpyridine)iridium($Ir(ppy)_3$), iridium(III)bis[(4,6-difluorophenyl)-pyridinato-N,$C^{2'}$]picolinate(FIrpic), platinum octaethylporphyrin(PtOEP).

The thickness of the EML 216 can be from about 5 nm to about 500 nm, preferably, from about 20 nm to about 100 nm, and more preferably is about 75 nm. The EML 216 can be a continuous film that is non-selectively deposited (e.g. spin-coating, dip coating etc.) or discontinuous regions that are selectively deposited (e.g. by ink-jet printing). EML 216 may also be fabricated by vapor deposition, sputtering, vacuum deposition etc. as desired.

The EML 216 can be composed of at least two light emitting elements chosen, for example, from those listed above. In the case of two light-emitting elements, the relative concentration of the host element and the dopant element can be adjusted to obtain the desired color. The EML 216 can be fabricated by blending or mixing the elements, either physically, chemically, or both. The EML 216 can emit light in any desired color and be comprised of polymers, co-polymers, dopants, quenchers, and hole transport materials as desired. For instance, the EML 216 can emit light in blue, red, green, orange, yellow or any desired combination of these colors and in some applications, may include a combination of emitting elements which produce white light.

In addition to active electroluminescent materials that emit light, EML 216 can also include materials capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, triphenylamine, and triphenyldiamine. EML 216 may also include semiconductors, such as silicon, gallium arsenide, cadmium selenide, or cadmium sulfide.

The OLED device 205, though shown with only a single emissive layer EML 216, can also include second emissive layer, or second and third emissive layers deposited on the first emissive layer. Furthermore, EML 216 can also be composed of two or more emissive units. Each of the light-emissive units includes at least one light-emissive layer. The light-emissive units are partitioned from each other by at least one charge generation layer.

Second Electrode 217:

In the bottom-emitting configuration of device 205, the second electrode 217 functions as a cathode (the cathode is a conductive layer which serves as an electron-injecting layer and which comprises a material with a low work function). While the second electrode can be comprised of many different materials, preferable materials include aluminum, silver, gold, magnesium, calcium, cesium, barium, or combinations thereof. More preferably, the cathode is comprised of aluminum, aluminum alloys, or combinations of magnesium and silver. Additional cathode materials may contain fluorides such as LiF and the like. Second electrode 217 though shown as a single layer may be composed of a plurality of sub-layers composed of one or more of the above materials in any desirable combination.

The thickness of the second electrode 217 is from about 10 nm to about 1000 nm, preferably from about 50 nm to about 500 nm, and more preferably, from about 100 nm to about 300 nm. While many methods are known to those of ordinary skill in the art by which the second electrode 217 may be deposited, vacuum deposition and sputtering methods are preferred.

Index Bridging Elastomer 230

OLED device 205 as shown is a bottom-emitting OLED, and thus, the light emitted from the EML 216 passes outside the device through the substrate 208. In accordance with various embodiments of the invention, an index bridging elastomer 230 is disposed on the exposed side of the substrate 208 (and thus, on the exterior of the OLED device 205) to prevent unwanted wave guiding (internal reflections) and enhance the total light output from EL apparatus 200. In at least one embodiment of the invention, the elastomer 230 can be fabricated from or comprises a flexible or semi-flexible material. In at least one embodiment of the invention, the apparatus 200 is intended for use in treating the human body and more specifically, in treating or exposing human skin (one example of an "intended target" for apparatus 200) to light. Ordinarily, the light exiting substrate 208 would encounter air with a refractive index of 1.0. This will cause less light to be transmitted to the intended target due to 1) total internal reflection which traps light in the substrate and/or 2) diffusion of light in the surrounding air. To remedy this, the index bridging elastomer 230 will be fabricated/chosen to have a refractive index at least roughly the same as the refractive index as the substrate 208 of the OLED device 205. In other embodiments of the invention, the index bridging elastomer 230 will have a refractive index similar to or smaller than the refractive index of the intended target. For instance, the index bridging elastomer could be chosen such that it has a refractive index between the refractive index of the substrate and the refractive index of the intended target. In the case of human skin, for example, it has been shown to have a refractive index at its boundary of around 1.47. This is close to the refractive index of a glass substrate at 1.5. In such an application, for instance, the index bridging elastomer can be chosen so as to have a refractive index of 1.48 or so.

The chemical composition of the elastomer 230 will depend upon the properties, e.g. the refractive index, of the substrate 208 from which light is passed thereto and upon the physical and chemical characteristics suitable for the intended use/application of the apparatus 200. In the case of applications for treating the human skin desired property of materials used in fabricating an index bridging elastomer include the following. The elastomer should have no strong absorption effect with respect to the emissive wavelength of OLED device 205. The elastomer should be compatible with human skin and should not cause side effects with the skin or with the applied drug. The elastomer used in such an application should have suitable mechanical properties for treatment of skin. For instance, the elastomer should be soft enough such that it can form a seamless contact with both the glass surface and the skin surface with a very small magnitude of compressed force. The elastomer also should be hard enough such that the elastomer will not change its shape permanently or flow out of the emissive area during handling or operating period. Dramatic shape change or flow could cause air gap and affect the light output. In some embodiments of the invention, pressure-sensitive adhesives and very thin layer of liquid gel can be used to enhance the interfacial contact.

In some embodiments, the thickness and the shape of the skin-contact surface for the elastomeric materials can also be adjusted based on the applied area. For example, based on the shape of the skin surface, the skin-contact surface of the elastomeric materials can be fabricated into corresponding shape so that they perfectly fit to each other without using too much external force. For example, a contour image of the treatment area can be obtained by imaging or other means. The elastomer can then be fabricated in a shape which matches the obtained contour. The thickness of the index bridging elastomer 230 will depend on the applications and the size of the OLED source, e.g. ranging from one micron to one meter.

In at least one embodiment of the invention, the apparatus 200 is intended for use in enhancing efficiency for OLED lighting sources with cover. Due to the air gap between OLED surface and cover materials, wave guiding effect in the OLED glass substrates also occurs. The transparent or semi-transparent cover materials usually have similar or larger refractive index compared to the OLED glass substrate. An index bridging elastomer between the OLED glass substrate and the lighting cover also should effectively eliminate the waving guiding effect in the OLED glass substrate. Desired properties of materials used in fabricating an index bridging elastomer include the following. It should have no strong absorption effect with respect to the emissive wavelength of OLED devices. Such materials should be compatible with the lighting cover. The refractive index of the elastomer is preferably similar to that of the OLED glass substrate and similar or smaller than that of the lighting cover. The elastomeric materials can be applied in a similar ways as those in human skin target. Alternatively, it can be applied in the form of liquid to fill the gap between the OLED glass substrate and the lighting cover, and then cured or solidified by heat, moisture or UV irradiation.

The index bridging elastomer 230 can be selected from commercially available elastomers such as silicone elastomers. Silicone elastomers have a refractive index very close to glass, human skin, and many transparent plastics such as PMMA or polycarbonate. Silicone elastomers have very good thermal and chemical resistance and are compatible with human skin. Silicone elastomers can be conveniently cured and processed into desired shapes by techniques well known in the existing arts. The use of silicone elastomers is merely exemplary, the use of other elastomers is also within the scope of this invention.

Some embodiments utilize pressure-sensitive adhesives (self-curing or curable), and optical gel (non-curing) layers which also provide index matching with the substrate. Adhesives provide the additional benefit of mechanical strength. Optical Adhesives or gels (non curing) are available from different sources. The use of index matching optical adhesives and/or optical gels to bridge the OLED transparent layer and the intended target is also within the scope of this invention.

Top Emitting OLED Devices

In an alternative configuration to that shown in FIG. 1 and described above, the first electrode 211 functions as a cathode (the cathode is a conductive layer which serves as an electron-injecting layer and which comprises a material with a low work function). The cathode, rather than the anode, is deposited on the substrate in the case of, for example, a top-emitting OLED. In this alternative configuration, the second electrode layer 217 functions as an anode (the anode is a conductive layer which serves as a hole-injecting layer and which comprises a material with work function greater than about 4.5 eV). The anode, rather than the cathode, is deposited on the semiconductor stack 214 in the case of a top-emitting OLED.

In embodiments where the OLED is "top-emitting" as discussed above, the anode may be made transparent or translucent to allow light to pass from the semiconductor stack through the top of the device. In such cases, the index bridging elastomer would be attached, bonded or cured to the anode (or to a glass or other material which encapsulates and protects the anode) rather than to the substrate as with a bottom-emitting OLED shown in FIG. 1.

EXAMPLES

In one exemplary embodiment, SYLGARD™ (a product of Dow Corning) elastomeric materials were used to fabricate an elastomer for use with an orange-emitting OLED. The approximate refractive index of SYLGARD is between 1.41 and 1.45. SYLGARD is a two-part elastomer which includes a polymer matrix and a cross-linking catalyst. The polymer matrix and cross-linking catalyst are mixed together and the mixture is cured at a given temperature for a certain period of time. For example, for SYLGARD 184, it was found that a formulation of 40 parts polymer matrix to one part catalyst, which is cured at 100 C for 10 minutes provides a flexible elastomer (suitable for human skin) of 2 millimeter thickness. This elastomer was tested with an orange emitting OLED device. After the elastomer was fabricated, it was cut to size and applied by hand pressure to an orange circular OLED pixel with a diameter of 2 centimeters operated at 100 mA, 4.3 V and 1000 nits. To test the pixel, a 2 cm square photodiode was used over the light emitting side of the OLED (without the elastomer) and on the elastomer itself in the second case. The photodiode current of the OLED itself without an elastomer attached was 1.38 milliamps. The photodiode current after the elastomer was applied over the OLED was 2.89 milliamps. This is an increase of over 100% in the photodiode current and implies an increase in overall luminous output as well. In terms of color or spectrum shift, the addition of the elastomer was found to not significantly alter the color coordinates of the OLED emission spectrum. The CIE without the elastomer was (0.605, 0.394) and with the elastomer was (0.604, 0.395).

Figure 2:
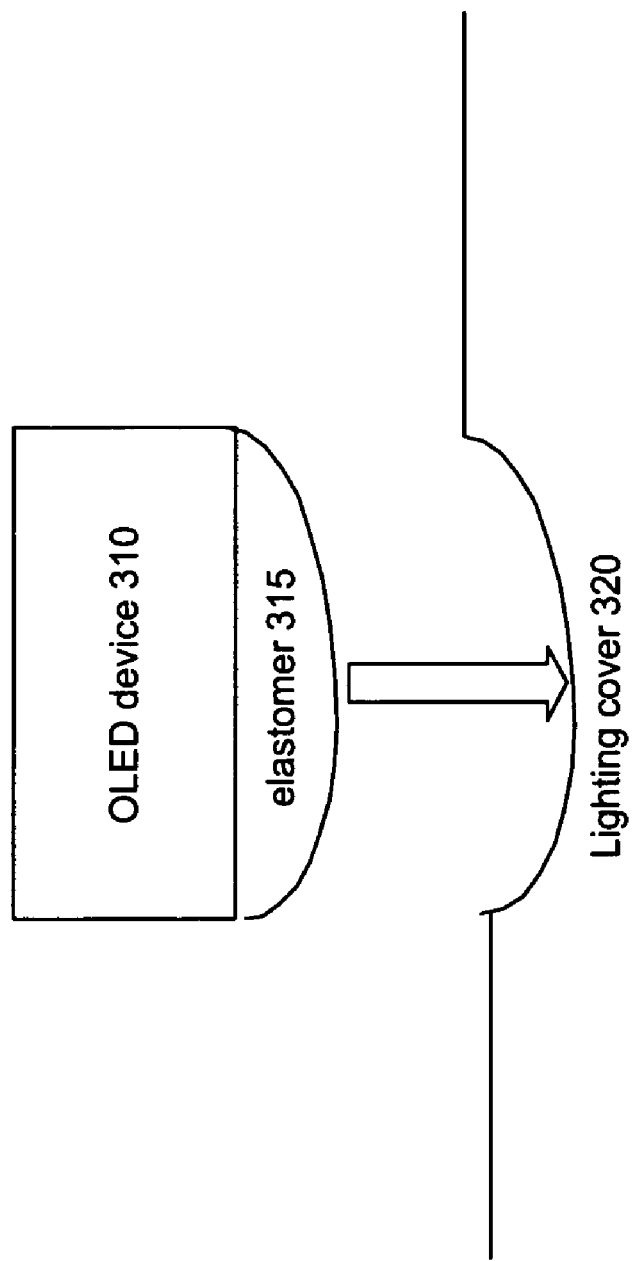
FIG. 2 illustrates one application of the invention.

FIG. 2 illustrates one application of the invention. An OLED device 310 is utilized to provide light through and beyond a lighting cover 320 to, for example, a swimming pool (not shown). Lighting cover 320 may provide just a protective function or in other embodiments could also have lensing, polarizing, color filtering and other such optical effects. The lighting cover 320 likely has a contour shape different from that of the light emitting side of OLED device 310. This difference will likely create an air gap between the lighting cover 320 and the OLED device 310. Because of the differing refractive indices of the substrate of the OLED device, air and lighting cover 320, there will be some loss of luminance due to multiple reflections and refractions. In accordance with the invention, an index bridging elastomer 315 is provided to eliminate one source of the loss. The elastomer 315 would be chosen/fabricated such that it has the same or roughly the same refractive index as lighting cover 320 and/or the refractive index of the light emitting side of OLED 310. Further, the index bridging elastomer 315 would be fabricated to have an outer contour which matches the contour of lighting cover 320. The shape of lighting cover 320 can be imaged or made into a mold or extrusion. Elastomer 315 can be cut to shape based on the image or molded or extruded as needed. Alternatively, the elastomer can be applied in the form of liquid to fill the gap between the OLED glass substrate and the lighting cover, and then cured or solidified by heat, moisture or UV irradiation.

Figure 3:
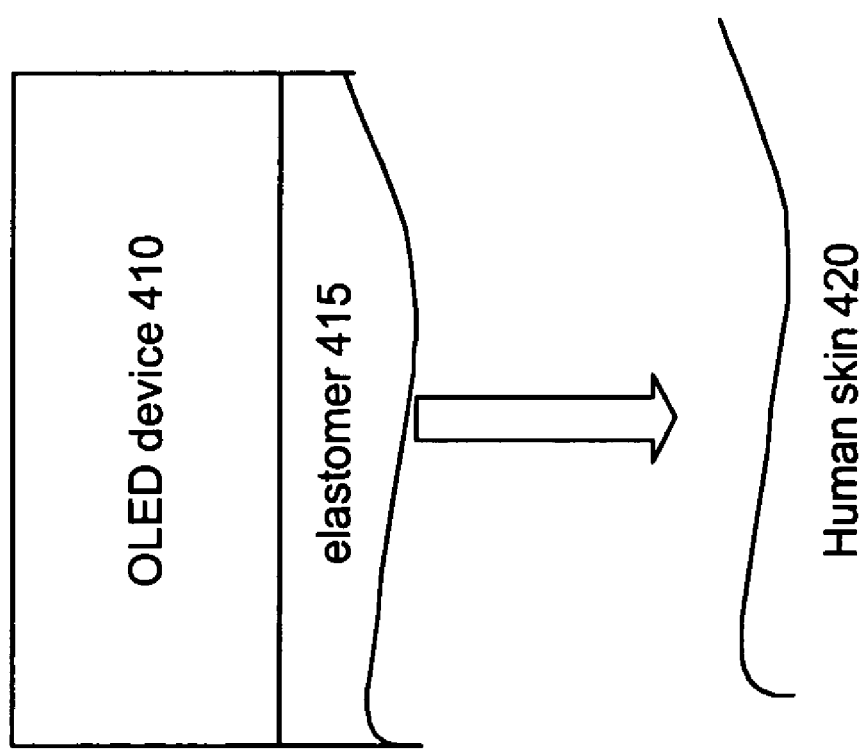
FIG. 3 illustrates yet another application of the invention.

FIG. 3 illustrates yet another application of the invention. An OLED device 410 is utilized to provide light to the surface or beyond the surface of human skin 420, for example, in a medical treatment context. Skin 420 likely has a contour shape different from that of the light emitting side of OLED device 410. This difference will likely create an air gap between skin 420 and the OLED device 410. Because of the differing refractive indices of the substrate of the OLED device 410, air and skin 420, there will be some loss of luminance due to multiple reflections and refractions. In accordance with the invention, an index bridging elastomer 415 is provided to eliminate one source of the loss. The elastomer 415 would be chosen/fabricated such that it has the same or roughly the same refractive index as skin 420 and/or the refractive index of the light emitting side of OLED 410. Further, the index bridging elastomer 415 could be fabricated to have an outer contour which matches the contour of skin 420. The contour of skin 420 can be imaged or made into an impression mold. Elastomer 415 can be cut to shape based on the image or molded or extruded as needed.

The OLED lighting sources and displays produced from a combination or arrays of OLED devices described earlier can be used within applications such as information displays in vehicles, industrial and area lighting, telephones, printers, and illuminated signs.

As any person of ordinary skill in the art of light-emitting device fabrication will recognize from the description, figures, and examples that modifications and changes can be made to the embodiments of the invention without departing from the scope of the invention defined by the following claims.

What is claimed:

1. An optical apparatus, comprising:
    an electroluminescent apparatus, comprising:
        an OLED device comprising a layer stack comprising at least one light emitting layer, and a substrate comprising a first surface that contacts said layer stack, wherein said substrate is capable of at least partially transmitting light from said at least one light emitting layer and out from the OLED device to a target; and
        an index bridging elastomer disposed on a second surface of said substrate opposite to the first surface, said index bridging elastomer having a first surface that contacts the substrate, a second surface that forms an exterior surface of the electroluminescent apparatus, and a refractive index roughly matching that of at least one of said substrate and said target, wherein said index bridging elastomer comprises an elastomeric material and wherein the second surface of the index bridging elastomer is smooth; and
    the target, wherein the target is a lighting cover and wherein the second surface of said index bridging elastomer is contacted seamlessly with said target.

2. The apparatus of claim 1 wherein said index bridging elastomer is contacted seamlessly with both said substrate and said target.

3. The apparatus of claim 2 wherein said index bridging elastomer is fabricated to have a shape matching a contour of said target.

4. The apparatus of claim 1 wherein said index bridging elastomer is fabricated to have a shape matching a contour of the lighting cover.

5. The apparatus of claim 1 wherein said index bridging elastomer has a refractive index close to both said substrate and said target.

6. The apparatus of claim 1 wherein said index bridging elastomer has a refractive index close to said substrate, but smaller than the refractive index of said target.

7. The apparatus of claim 1 wherein said index bridging elastomer has a refractive index between said substrate and said target.

8. The apparatus of claim 1 wherein said index bridging elastomer has no strong absorption with respect to light emitted by said OLED.

9. The apparatus of claim 1 wherein the index bridging elastomer is compatible with both the substrate and the target.

10. The apparatus of claim 2 wherein said index bridging elastomer forms seamless contact with said substrate and said target through physical or chemical methods.

11. The apparatus of claim 10 wherein said seamless contact is formed through a small magnitude of applied force.

12. The apparatus of claim 2 wherein pressure sensitive adhesives and/or liquid gels with matching refractive index are used to enhance interfacial contact.

13. The apparatus of claim 1 wherein said index bridging elastomer is a silicone elastomer.

14. The apparatus of claim 1 wherein said index bridging elastomer is disposed by applying and curing a liquid containing elastomeric material over said substrate.

15. The apparatus of claim 1 wherein the refractive index of the index bridging elastomer is about 1.48.

16. The apparatus of claim 15 wherein the target is formed of a glass material.

17. The apparatus of claim 1 wherein the refractive index of the index bridging elastomer is between 1.41 and 1.45.

18. The apparatus of claim 17 wherein the target is formed of a glass material.

19. The apparatus of claim 1 wherein the lighting cover protects the OLED device.

20. The apparatus of claim 1 wherein the lighting cover is formed of a material that is transparent or semi-transparent at a wavelength of light emitted by said OLED device.

21. The apparatus of claim 20 wherein the lighting cover is formed of a glass or plastic material.

22. The apparatus of claim 1 wherein the index bridging elastomer is positioned between the OLED device and the lighting cover and the refractive index of the index bridging elastomer has a value close to the substrate, but smaller than a refractive index of the target.

23. An optical apparatus, comprising:

an electroluminescent apparatus, comprising:

an OLED device comprising a layer stack comprising at least one light emitting layer and a substrate capable of at least partially transmitting light emitted by the at least one light emitting layer, the substrate comprising a first surface that contacts the layer stack and a second surface opposite the first surface; and an elastomeric layer comprising a silicone elastomer material and having a first surface that contacts the second surface of the substrate, and a smooth second surface that seamlessly contacts a target, wherein a refractive index of the elastomeric layer roughly matches at least one of a refractive index of the substrate and a refractive index of the target; and the target, wherein the target is a lighting cover.

24. An optical apparatus, comprising:

an electroluminescent apparatus, comprising:

an OLED device comprising a layer stack comprising at least one light emitting layer and a substrate capable of at least partially transmitting light emitted by the at least one light emitting layer, the substrate comprising a first surface that contacts the layer stack and a second surface opposite the first surface; and an elastomeric layer comprising an elastomeric material and having a first surface that contacts the second surface of the substrate, and a smooth second surface that seamlessly contacts a target, wherein a refractive index of the elastomeric layer roughly matches a refractive index of the substrate and is smaller than a refractive index of the target; and the target, wherein the target is a lighting cover.

* * * * *